United States Patent [19]
Magnuson

[11] Patent Number: 4,967,155
[45] Date of Patent: Oct. 30, 1990

[54] ENVIRONMENTALLY CONTROLLED MEDIA DEFECT DETECTION SYSTEM FOR WINCHESTER DISK DRIVES

[75] Inventor: Vernon P. Magnuson, Canoga Park, Calif.

[73] Assignee: Micropolis Corporation, Chatsworth, Calif.

[21] Appl. No.: 179,512

[22] Filed: Apr. 8, 1988

[51] Int. Cl.⁵ ............... G01R 33/12; G01R 31/02; H05K 5/00; H05K 7/00
[52] U.S. Cl. ................ 324/212; 324/158 F; 360/31; 361/384; 361/390; 369/53
[58] Field of Search .................. 324/210–212, 324/73 R, 73 AT, 73 PC, 158 F; 360/31; 361/383, 384, 390, 391, 413, 415; 369/53, 75.1

[56] References Cited

U.S. PATENT DOCUMENTS

| | | | |
|---|---|---|---|
| 3,656,058 | 4/1972 | Leathers | 324/158 F |
| 4,145,620 | 3/1979 | Dice | 324/73 PC X |
| 4,179,724 | 12/1979 | Bonhomme | 361/391 |
| 4,504,871 | 3/1985 | Berwick et al. | 324/210 X |
| 4,636,726 | 1/1987 | Santomango et al. | 324/158 F |
| 4,683,424 | 7/1987 | Cutright et al. | 324/158 F |
| 4,754,397 | 6/1988 | Varaiya et al. | 369/75.1 X |

Primary Examiner—Gerard R. Strecker
Attorney, Agent, or Firm—Poms, Smith, Lande & Rose

[57] ABSTRACT

An environmentally controlled media defect detection system for Winchester disk drives includes a testing cabinet which is divided into two sections. The first section is maintained at an environmentally controlled elevated temperature for testing Winchester disk drives at elevated operational temperatures above ambient room temperatures. The second section is thermally insulated from the first section and contains a plurality of disk drive test units. One test unit is coupled to each Winchester disk drive being tested, and the test units have the ability to apply digital signals to the drive for writing and reading signals onto tracks of the drives, determining malfunctions, and imperfections in the disk media of the hard disk drive systems.

9 Claims, 11 Drawing Sheets

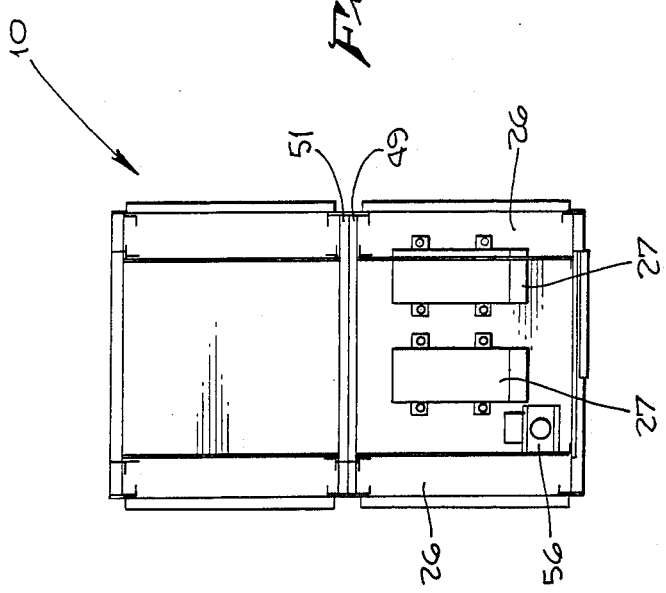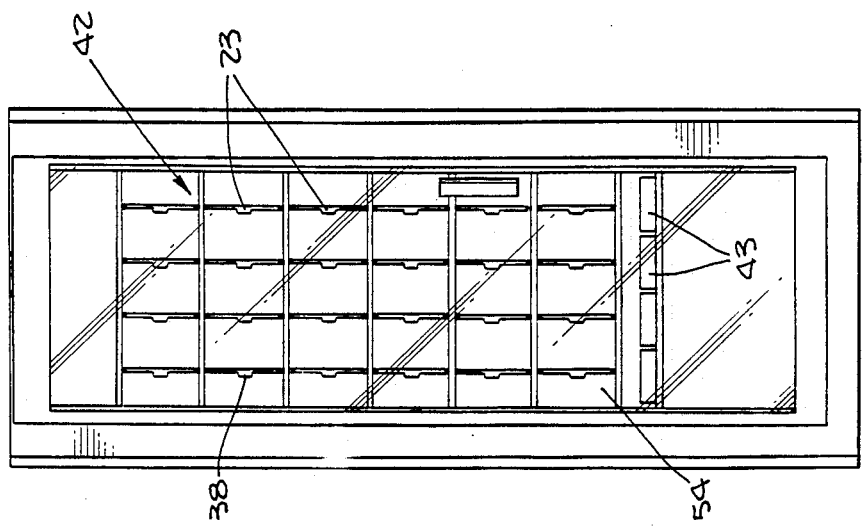

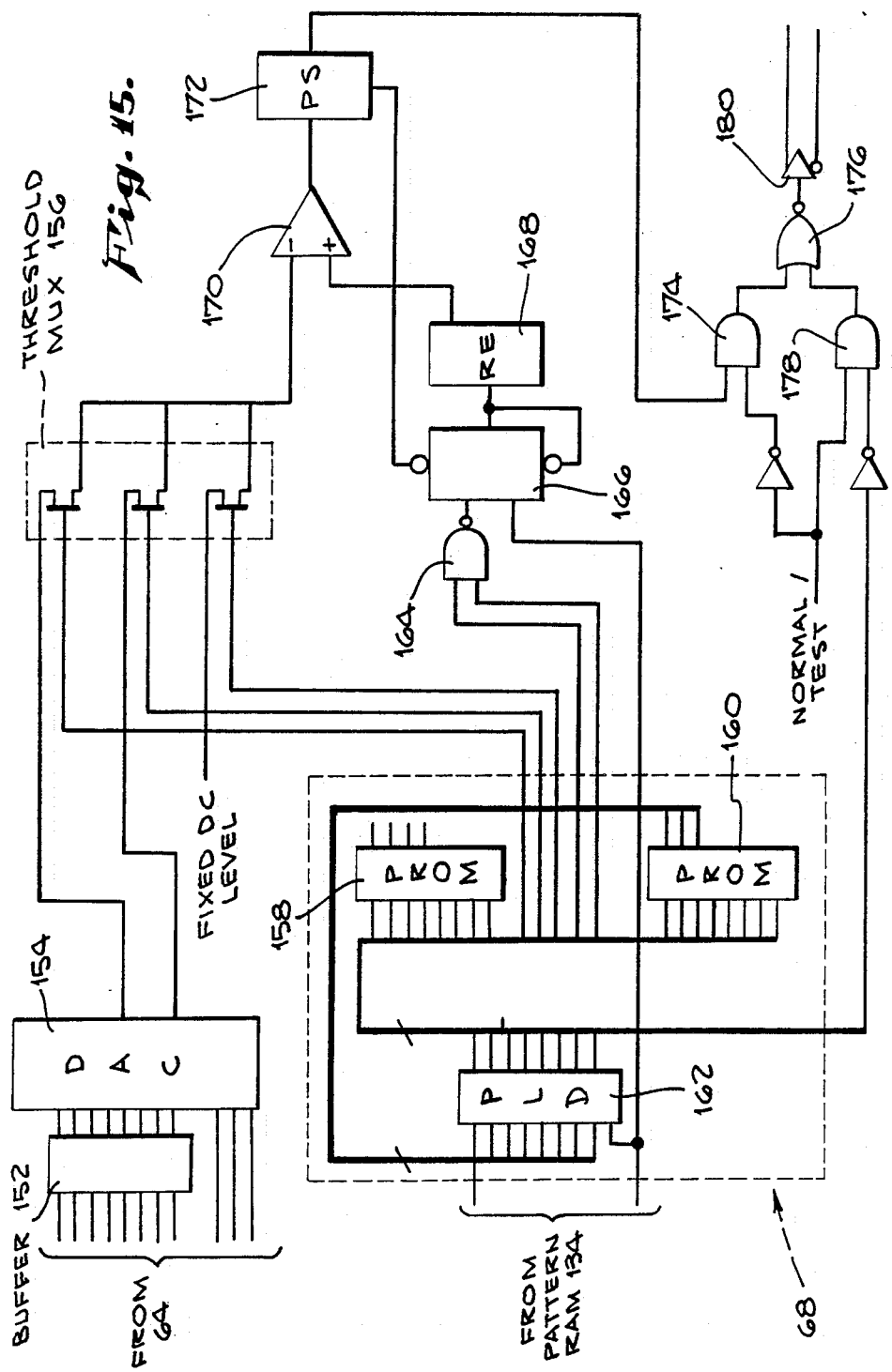

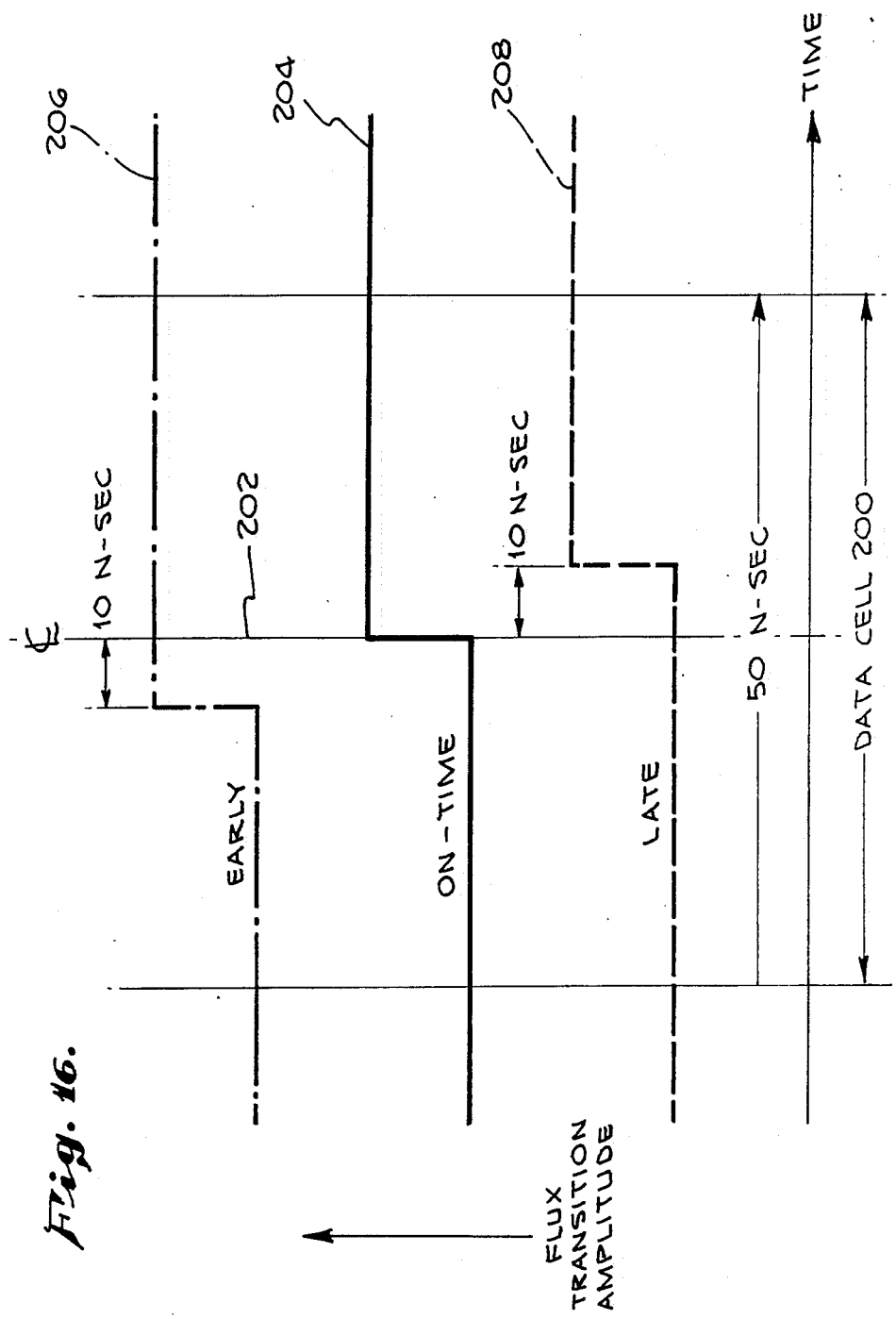

ENVIRONMENTALLY CONTROLLED MEDIA DEFECT DETECTION SYSTEM FOR WINCHESTER DISK DRIVES

FIELD OF THE INVENTION

This invention relates to systems for testing for media defects in Winchester disk drives. More particularly, this invention relates to an environmentally controlled media defect detection system for Winchester disk drives.

BACKGROUND OF THE INVENTION

Winchester disk drive systems comprise a vital component for modern computer systems and are used for the storage of large amounts of the data which is accessible at very fast rates. In a Winchester-type disk drive, the magnetization of successive small data cells on a magnetic surface of a disk, allows the storage of in excess of 350 million bytes, or Mega-bytes (350 MBytes) of information in a standard five and one-quarter inch Winchester disk drive. Winchester disk drive systems have a plurality of hard disks made from aluminum and coated with some type of recording media such as magnetic oxide or magnetic metallic material. Each side of the disk may be coated with recording media and each side can store data. Each surface of the disk is associated with its own "read" and "write" head.

The read and write heads are mechanically linked to form a head positioner assembly and the heads move as a single unit across the surface of the disk. Disks are preferably driven by D.C. brushless motors at relatively high speeds in the order of 3600 revolutions per minute (RPM). As the physical size of hard magnetic storage disks drive systems has been reduced, the capacity for storing information has increased. Magnetically stored data is now packed into the disk drive system which must operate with a high reliability factor. For example, no more than 10 uncorrectable errors in $10^{13}$ bits transferred are permitted in the system. The Winchester disk drive system interfaces with a microprocessor controller by the use of large scale integrated (LSI) disk controllers which perform the function of disk drive selection, track selection, sector selection, head loading and error checking. An important part of Winchester disk drive operation is that the disk drive must effectuate data separation and decoding necessary to allow the interface system to synchronize itself to the actual data rate of the disk drive so data may be transferred in an orderly manner to the central processing unit. All Winchester disk drives recover data under certain constraints built into any system. The data rate detected by the data separation circuitry varies from drive to drive due to mechanical factors such as motor speed tolerances. Data is written in a pattern on media through the heads. The media may have defects inherent on its surface. Additionally, the disks spin at a rate which differs slightly from drive to drive. The data recovery patterns must therefore be individually synchronized. In order for a Winchester disk drive system to operate reliably and for the disk controller to transfer data to a central computer in reliable manner, data separation circuitry has operated on phase-locked loop technology. The electronic controller must write a pattern on the Winchester disk drive media and be able to read this pattern back relatively error-free. After a pattern is written into a disk drive on the disk media of the system, the Winchester controller must determined whether the flux reversal that is read is a logical "one" or a logical "zero" In order to do this, the controller must determine where a particular flux reversal occurs relative to others in the media. When a phase-locked loop is used to synchronize the data already written on the disk for use by a central computer, a reference clock signal is generated by the phase-locked loop which is used to determine where each flux reversal is located relative to the other flux patterns. In this sense, the phase-locked loop clock "opens a window", and if the flux reversal is in the window, it is a logical "one"; otherwise the system registers a logical "zero". Although this is at best an extreme simplification of how data is interpreted by a Winchester disk drive controller and central computer, the key factor is to determine whether a given window has recorded a flux reversal or not. The actual position of the flux reversal within the data window is not critical itself. Typically, at the speed and data density with which Winchester disk drives may operate, a data window is only 50 nanoseconds wide.

Within the Winchester disk drive system, the data separation circuitry functions to synchronize the interface circuitry with the data stream coming from the disk. The controller uses the 50 nanosecond window established when the data was recorded and verified by the data separator to reconstruct the data previously recorded on the hard disk drive system. Within the data separation circuity, an analog phase-locked loop may provide the reliability required for accurate data separation. The phase-locked loop constantly analyses the frequency of input real time signals from the hard disk drive and locks a variable oscillator, usually a voltage-controlled oscillator, to that frequency. Using analog phase locked loop techniques, a data separator circuit can be designed so as to achieve a better than plus or minus one nanosecond resolution. The 50 nanosecond window generated by the phase-locked loop of the Winchester disk drive gives the flux reversal signal a maximum of plus-or-minus 25 nanoseconds of shift before the read channel would mistake a "one" for a "zero" or a "zero" for a "one".

Many different factors can cause the flux transition to shift within the data windows. These factors include head asymmetry; phase locked loop tracking error; pulse crowding; and media defects. All these factors have an adverse effect upon the accuracy or precision of the Winchester disk drive in assuring that a flux reversal is placed within the 50 nanosecond wide data window. The cumulative effect of these factors must not be allowed to go beyond the point where the drive can recover data reliably. In order to address the problem of media error, various forms of defect mapping have been undertaken in order to determine the positions on the drive that do not allow recovery of data within the maximum specified hard error rate. As indicated previously, a common maximum hard error rate is 10 bits in error in $10^{13}$ bits read. Conventional defect mapping techniques seek to minimize the mapping time or maximize the effectiveness of the defect map.

The most common methods of defect mapping include:

1. Straight Digital Reads and Writes This method requires a prohibitively long test period. An 85 megabyte (Mbyte) drive would take over 96 hours to achieve a minimally acceptable map.

2. Reduced Data Window with normal "Reads" and "Writes" of Data

Reducing the window width makes a read process much more sensitive to peak shift. This cuts down the time required to make up the location of media defects. Such a test which narrows the size of a window needs to account for extremes in peak shift, and defects may not be detected unless they exceed the window. Reductions in the window width cannot be too great or the drive will give errors everywhere and real defects will be lost in the storm of spurious information.

3. Analog "Missing" and "Extra-pulse" Detection

This technique assumes that most defect areas on the medium which cause excessive peak shifts will have an associated reduction in the analog read amplitude or an extra pulse or both. This assumption is not always true. Some areas of extreme peak shift have very little or no amplitude distortion.

4. Digital Verification of "Missing" and "Extra-pulse" Analog Information

In this method of defect mapping, the analog distortion areas determined as previously described are merely listed as suspect areas. Once the suspect areas have been identified, they can be examined with a severely reduced read" window to determine if there is any gross peak shift. Since there are only a few suspect analog areas, a large amount of time can be spent digitally testing and analyzing these areas. This is the most effective conventional method of defect mapping. Ultimately, the goal of any defect map is to provide a system in which it is both easy to spot hard- to-find defects, and also one in which these defects may be indicated in a relatively short testing period. Previous techniques have included "Phase Margin Analysis" as presented by Memory Technology, Inc., of Santa Clara, Calif., 95050. Memory Technology's Phase Margin Analysis requires making a complex logarithmic plot and re-reading the same track where a given track exhibits a phase shift indicative of a defect. The phase plot can be used to screen out those suspect data readings which represent hard defects and those which might represent defects of a more temporary or soft nature.

A window margin narrowing system has been proposed by Applied Circuit Technology of Anaheim, Calif., 92806. This system uses a shrinking window to determine the location of defects by statistically providing a sample effect window error rate. Both this system and the system of Phase Margin Analysis of Memory Technologies Inc., are relatively complex and require time consuming analysis of data prior to the mapping of defects on the media.

Applied Circuit Technology has proposed a device for measuring time-encoded data pulses written into a hard disk, which allows one to determine whether a drive under test meets required data pulse dispersion limits, which it calls a Time Domain Spectrum Analyzer (TDSA). The Spectrum Analyzer divides the data window into 50 time slots called "buckets." As data pulses are detected, the Analyzer determines at which of the buckets the data pulses fall. As data is read by the Analyzer, each pulse is recorded and pulse counts are accumulated as data read from over 1,000,000 data cells. A histogram may be derived by the Spectrum Analyzer which provides a distribution curve giving information on where within the average cell, the data transition or pulse is occurring. This histogram provides information useful to separate out expected noise from read circuit amplifiers, residual Disk Magnetism, and channel asymmetry; as well as peak and block shift interference, circuit phase shift, bias or cross talk, head positioning and damping. When these defects are factored out, the Analyzer purports to locate media flaws; however, the exact locations of such flaws within particular cells of a track is not provided except to the extent that accumulated data provides guidance.

SUMMARY OF THE INVENTION

The subject invention relates to an environmentally controlled apparatus for determining the relative position of a bit of information or flux reversal in a 50 nanosecond data recovery window (one nanosecond = $10^{-9}$ seconds). The time position of the flux reversal within the data recovery window is a relative measurement. One revolution of the disk drive for a single track on a single disk is sufficient, when made at the usual data rate, to allow the measuring of the relative positioning of the flux reversal within each data cell by assigning a number to each flux reversal within each data cell or window detected on the track. This number (from zero to 255) is an absolute measurement of the position of the flux reversal or data bit within the data recovery window. Prior Art defect measurement systems would not be able to detect data flux locations within a window because they are directed to systems which determine that the data has been written either inside or outside the window. The assignment of a number to each flux transition detected, measured relative to the end of the preceding phase locked loop window, allows the detection of a defect without the need for an extreme peak shift to arise before the defect can be detected.

The system for testing Winchester disk drives of this invention within an environmentally controlled system comprises a test cabinet including a first and a second section. The first section of the test cabinet includes a means for environmentally controlling the temperature therein at an elevated temperature to simulate the heated conditions of disk drive operation.

A second section of the testing cabinet is thermally insulated from the first section. This second section receives a plurality of test units which are each coupled to a Winchester disk drive housed in the first section and undergoing tests.

Each of the test units includes means for applying and writing digital signals on the drive and reading the signals from the drive to determine malfunctions in each of the drives, where the malfunction is measured as a relative positioning of the flux transition within each data cell along each track of the drives. The test units are housed in modular compartments within the second section of the testing cabinet. Each test unit is associated with a separate and unique disk drive under test.

An air flow system is included with a thermostatically controlled means for maintaining a uniform temperature in the disk drive compartment. By environmentally isolating the disk drive compartment from the test board compartment, independent environmental control of the disk drive compartment can be maintained. Maintaining independent environmental control for the disk drives eliminates a number of causes of flux transition other than defective media. Because the test units are modular, the cabinet may be used to test one or many disk drives at the same time while maintaining the same uniform environmental control.

The testing system of this invention is used to test the response and validity of a Winchester disk drive system and comprises a mechanism for writing data into a plurality of disk drives under test through use of independent test circuit units or boards, each unit or board associated with a different disk drive under test. These test units or boards have circuitry for reading data from the disk drives to verify the accuracy and precision with which the drive reads data and to locate disk drive defects in the system.

The data writing means includes a means for deliberately shifting the position of the data within the data cell of each of the data cells of a disk drive track to predetermined locations within the cell. This disk drive is then read by the test boards to confirm the ability of the disk drives to properly read data written by the position shifting circuitry as off center data within the data cells.

After the data which has been written and shifted, then read back, is accumulated for each separate data cell, that data is processed and enhanced in order to flag defective portions of the disk media. The defective portions of the disk media are determined by statistics derived from numbers representative of the relative position of flux transitions or information bits within each data cell relative to the center of each data cell. The media defect detection system of the present invention is self-calibrated to factor out random errors in the system so that errors related to media defects are highlighted. The test unit provides a crystal-controlled phase-locked loop clock which is used to calibrate both the "write-shifted" pulses and the read operation for all the data cells or windows of each track of each disk. The defect detection system of the current invention processes large amounts of separate data for each cell to establish a random distribution around the center of each data window which is acceptable for flux reversals to occur in.

In this manner, peak shifts for any individual flux reversal can be calculated by scaling the counts to nanoseconds and subtracting the average. By repeating a read and write process over and over again, at least 8 times per track of each disk, a statistical determination of where the flux reversals occur within each data cell can be made and only the addresses of those data cells which show deviant flux transition positioning need be recorded initially. Further Winchester disk drive system.

BRIEF DESCRIPTION OF THE DRAWINGS

FIG. 7 is a rear elevational view of the testing cabinet showing a plurality of compartments for receiving the disk drive testing units which are connected each, respectively, to a disk drive under test;

FIG. 8 is a cross sectional view taken along lines VIII—VIII of FIG. 1;

FIG. 12 is a schematic block diagram of the digital circuitry board of the test unit for testing a disk drive;

FIG. 15 shows a detailed electrical schematic of the shifted "write" pattern source and related circuitry of FIG. 13; and, FIG. 16 is a diagrammatic showing of a typical data cell or window and the relative positioning of three transitions therein.

DETAILED DESCRIPTION OF THE PREFERRED EMBODIMENT

The environmentally-controlled media defect detection system for Winchester disk drives disclosed in this invention may be described in detail by reference to two major systems. Environmental control of the disk drive under test will first be discussed, followed by a detailed description of how each test unit functions in a modular fashion to test the particular Winchester disk drive with which it is associated.

Figure 2:
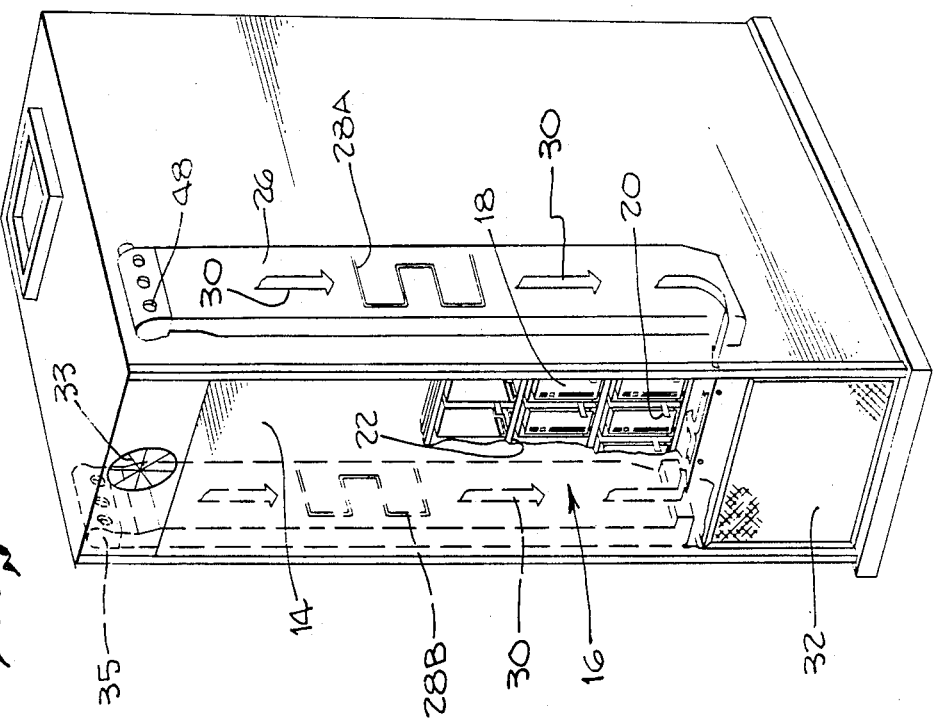
FIG. 2 is a perspective view of the testing cabinet as shown in FIG. 1 with particular emphasis on the air flow pathways used to environmentally control the temperature of the disk drives under test.
Figure 1:
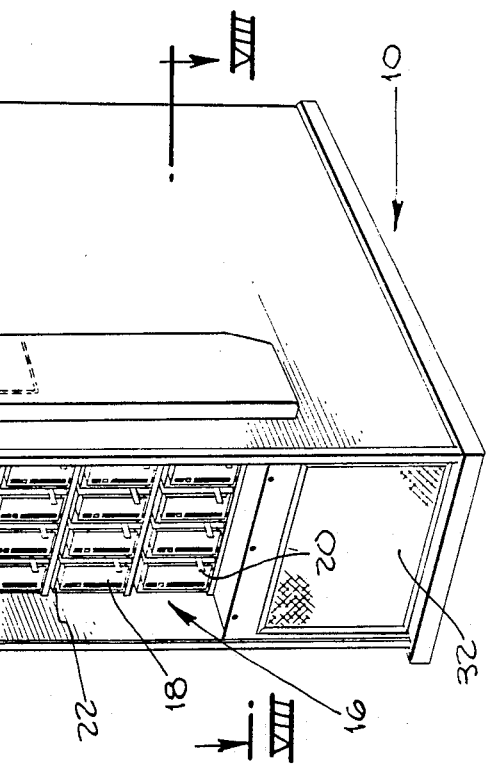
FIG. 1 is a perspective view of a testing cabinet which houses the system for testing Winchester disk drives, and illustrating one aspect of this invention.
Figure 10:
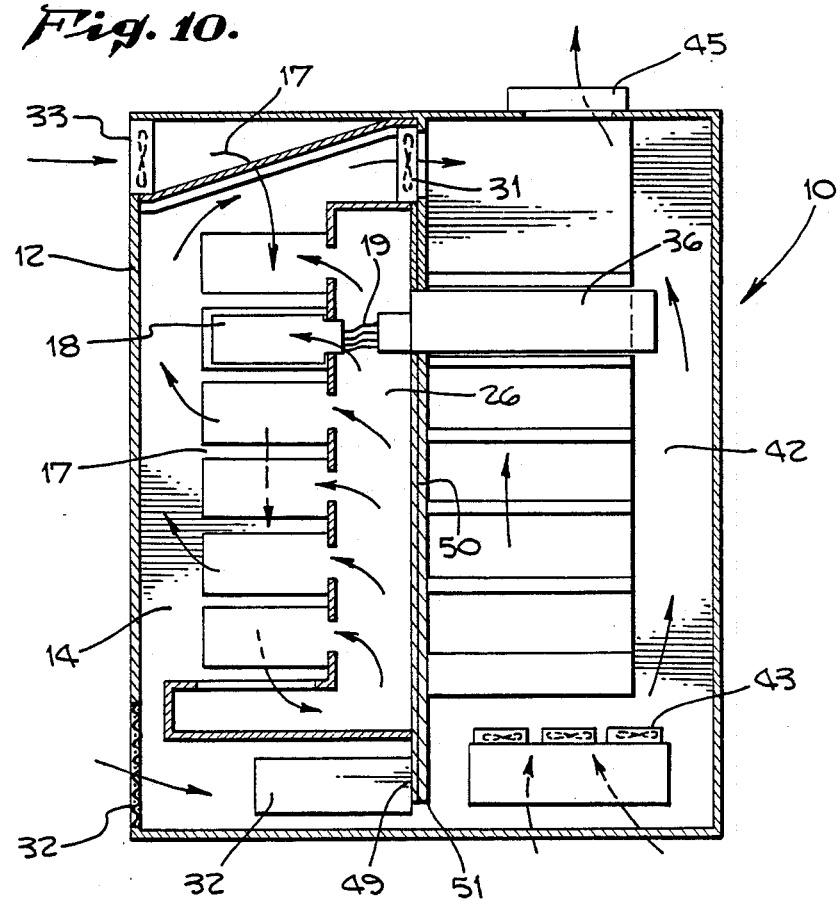
FIG. 10 is a cross-sectional view of the testing cabinet taken along line X—X of FIG. 5.

A testing cabinet 10 (FIG. 1) houses the environmentally controlled system for testing Winchester disk drives. (The drives 18 to be tested are of the 00 Series Class manufactured by Micropolis, Inc., the assignee herein.) With reference to FIGS. 1, 2 and 10, an environmental control of the system for testing Winchester disk drives comprises two main sections, the forward disk drive chamber 14 and the rear test unit chamber 42 (FIG. 10). These two chambers are separated by a double partition 50 comprised of walls 49 and 51. The double partition wall 50 separates two independent environmental control systems which operate within the testing cabinet 10. A set of intake fans 43 drawing air from outside the cabinet causes air to flow past the test boards 36 and out the exhaust 45, and forms one environmental control flow pattern for maintaining the electronic disk drive test control boards 36 at a relatively cool temperature for maximum operating efficiency. The test boards are protected from excessive heat in their chamber 42 due to their own operation as well as heat dissipated from the power supply section 32. The forward section of each test unit 36 is plugged into a ribbon cable 19 (FIG. 10) which in turn is connected to a respective drive unit 18. At the point where the forward connective end, of the test unit 36 penetrates through the double wall 50, a rubberized seal (not shown) may surround the slot 38 as to thermally isolate chamber 42 from chamber 14.

Figure 4:
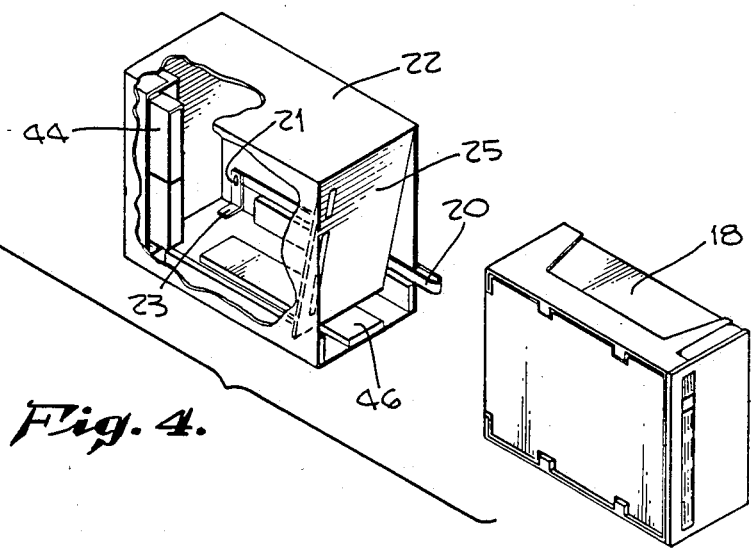
FIG. 4 is a perspective telescoped view of the manner in which a disk drive is modularly housed within a disk drive sleeve positioned within the first compartment shown in FIGS. 1 and 2.
Figure 5:
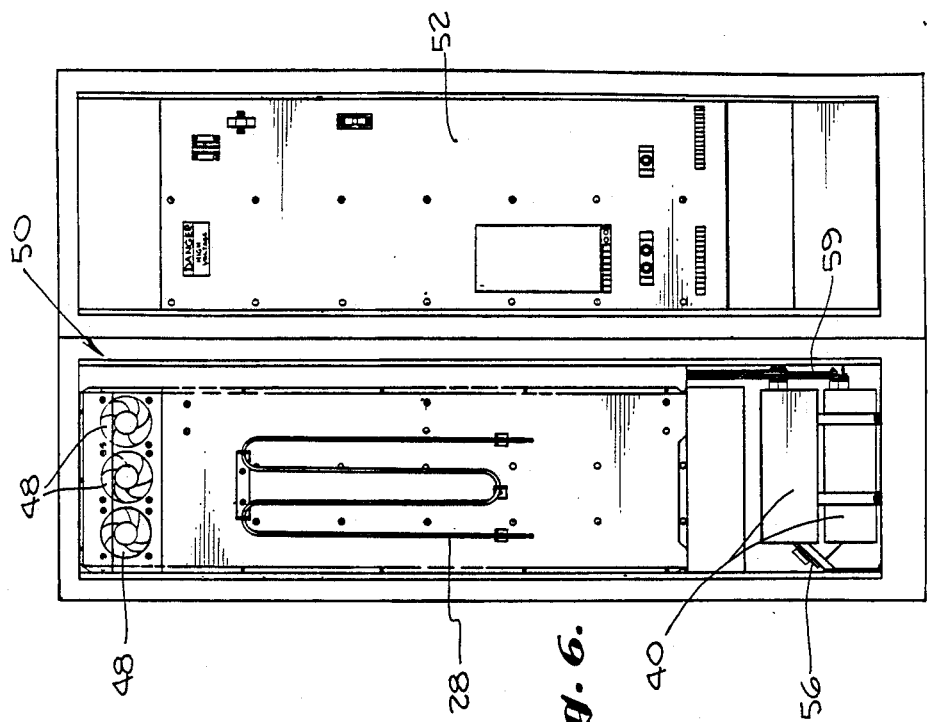
FIGURE 5 is a front elevational view of the testing cabinet of FIGS. 1 and 2.

The forward chamber 14 which houses the disk drives 18 which are being tested (FIG. 10) contains two separate but interrelated groups of environmental control devices. Automatic temperature control of the forward chamber 14 housing the disk drives may be obtained by setting the temperature controller 56 (FIG. 6) mounted near the DC power supplies 40. The temperature controller 56 controls the functioning of the heating coils 28 (FIG. 6) (also illustrated as heating coils 28A and 28B of FIGS. 1 and 2). Additionally, the, temperature control circulatory fans 35 and 48 (see FIGS. 1, 2, 6, and 9) are controlled by controller 56. As air flow circulates along the environmental air flow controller path 30 past the heating coils 28A (FIG. 2), this air passes through environmental controller air duct 26 and into the disk drive chamber 14. Air flows past each disk drive 18, through each disk drive compartment 16, forward along the disk drive sleeve 22 (See FIGS. 1, 2 and 10). If any of the sleeves 22 do not contain disk drives 18, a pivotal door 25 (FIGS. 4 and 5) vertically hangs from the top of sleeve 22 to maintain the air flow of the sleeve 22 as if a drive 18 were in place within the sleeve. The heated air then rises through the plurality of disk drive sleeves 22 and air is caused to flow within the sleeves and around each disk drive 18. As the air reaches the top it is recirculated by the fans 35 and 48 to begin the ventilation cycle again.

Once an internal temperature of the disk drive testing chamber 14 has reached 50° C., the thermostat 56 is set to turn off the heating coils 28A and 28B, with the circulating fans 35 and 48 operating continuously. Should the temperature within the chamber drop below the thermostatic setting of the controller 56, the heating coils 28 would be activated to maintain the disk drives under test at a uniformly elevated temperature, thus simulating severe working conditions. This temperature is maintained within each sleeve 22 whether filled with a drive 18 or empty but closed by pivotal door 25.

Figure 9:
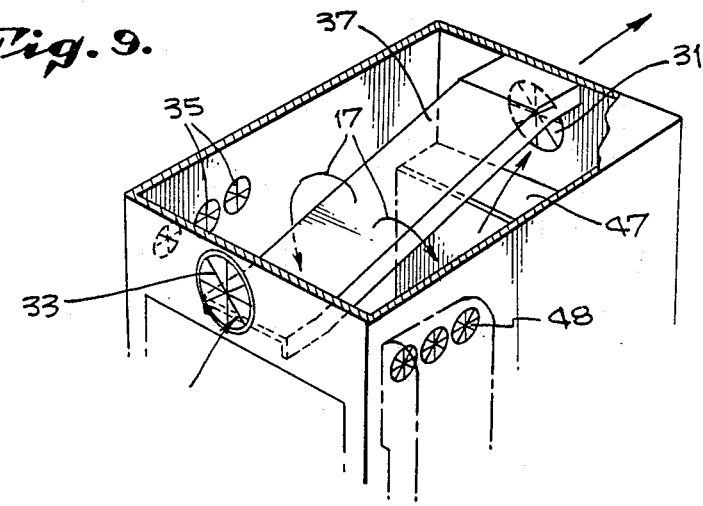
FIG. 9 is a perspective top view of the disk drive section of the testing cabinet of FIG. 1, with the top of the unit cut away.

In the event that the temperature within the disk drive chamber 14 rises significantly higher than 50° C., a cool air intake fan 33 (FIG. 10) may be activated to provide cooler air to the drives under test by passing this air through the intake fan 33 and up the inclined air flow pan 37 (FIG. 9) which extends over an exhaust fan 31. The sides of the inclined airflow pan 37 are designed to allow the cool air to spill over and down into the disk drive chamber 14 as indicated by arrows 17 (FIG. 9). The intake fan 33 and heat exhaust fans 32 may be activated until the temperature within the drive chamber 14 is brought down to a top desired temperature, such as 50° C.

Throughout the operation of this cooling system, the disk drive units 18 are maintained environmentally isolated from the test board chamber 42, so that the test boards are not heated unduly.

Power supplies 27 (FIG. 8) are provided for operating the test system, and they are mounted in the power supply compartment 32 (FIGS. 1 and 2).

The disk drives 18 are inserted into the disk drive testing chamber 14 into individual compartments 16 defined by the disk drive sleeves 22. A transparent disk drive chamber door 12 having a handle 58 (FIG. 5) allows one to store the separate disk drives under test into various compartments 16, all of which may be viewed by an operator during the testing phase.

Figure 3:
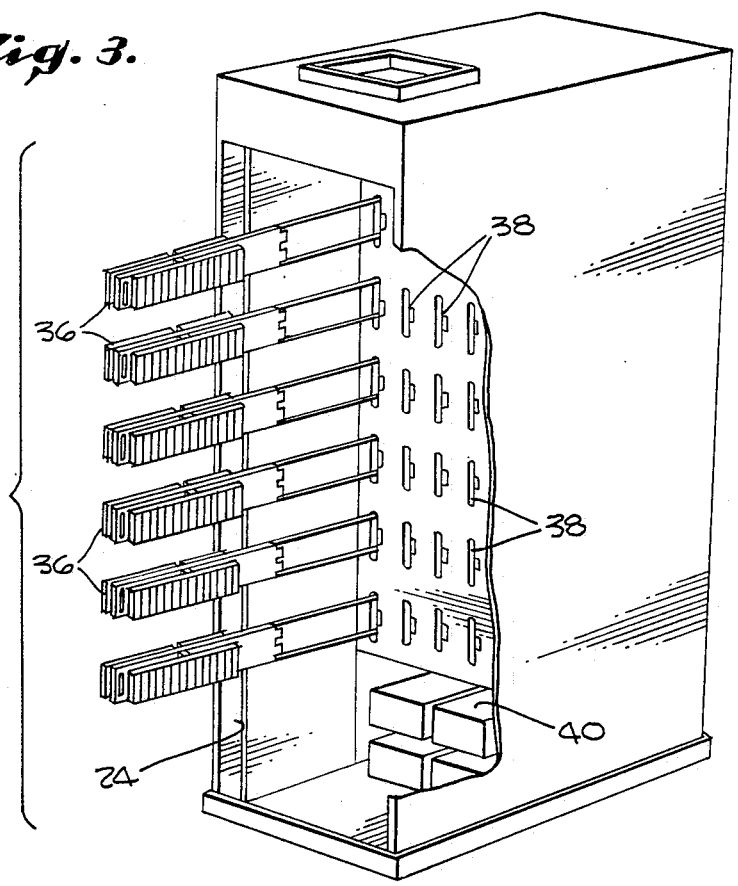
FIG. 3 is a rear perspective view of the testing cabinet of FIGS. 1 and 2 showing the manner in which the test units, are inserted into an isolated second section of the testing cabinet.

In a similar manner a rear door 54, usually opaque, may be opened to provide access to the testing chamber 42 so. that individual test units 36 may be inserted into test unit slots 38 (see FIG. 3 and FIG. 7). The test unit slots 38 are lined with a rubber air-tight sealant strip 23.

Figure 6:
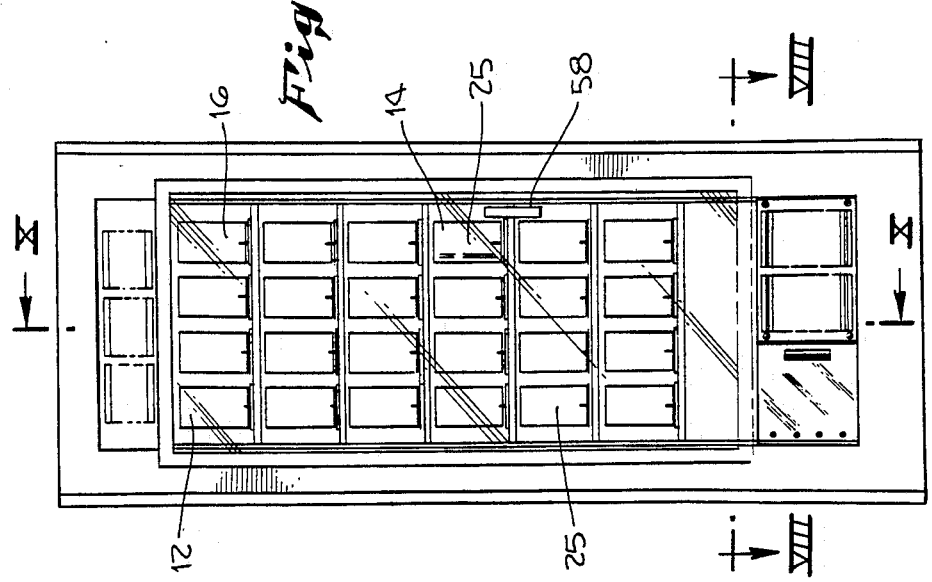
FIG. 6 is a side elevational view of the testing cabinet of this invention showing the heating coils for environmentally controlling the temperature of the disk drives being tested within the testing cabinet.

A bus bar 59 connects the main power supplies 40 to allow power to flow to individual disk drives and their respective test units (see FIG. 6). AC power may be controlled by the panel 52, shown in FIG. 6.

Figure 11:
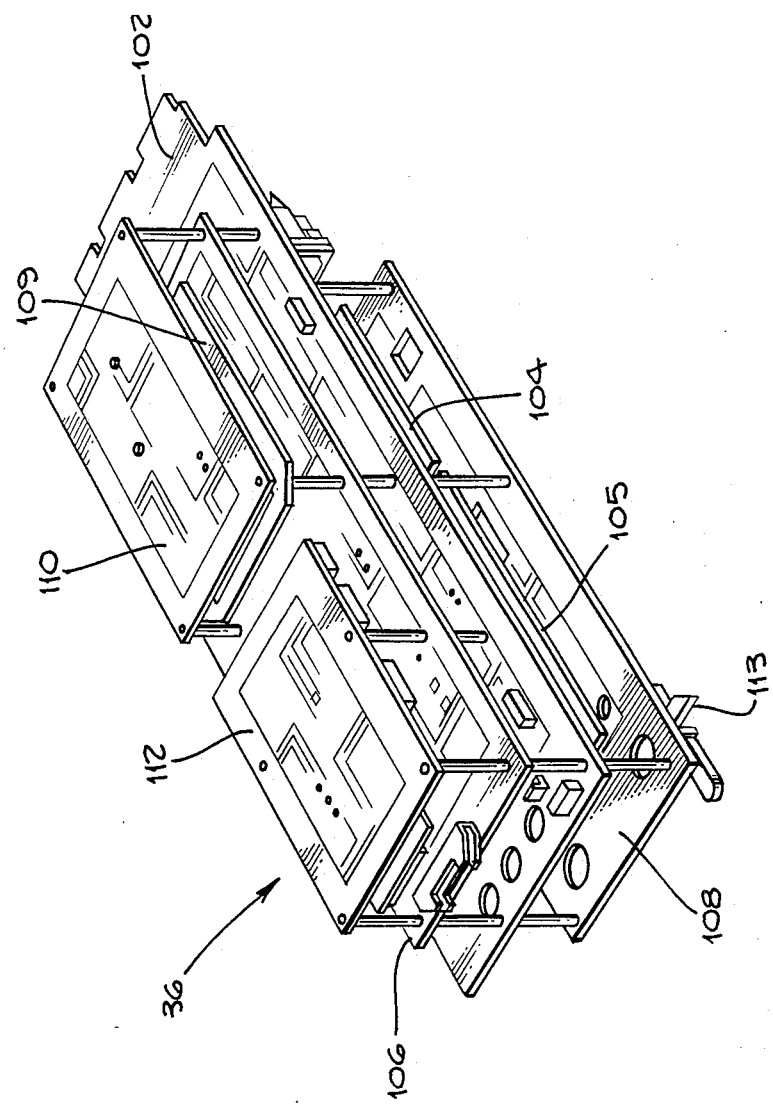
FIG. 11 is a perspective view of the physical configuration of a test unit used for testing a Winchester disk drive for defects.
Figure 42:
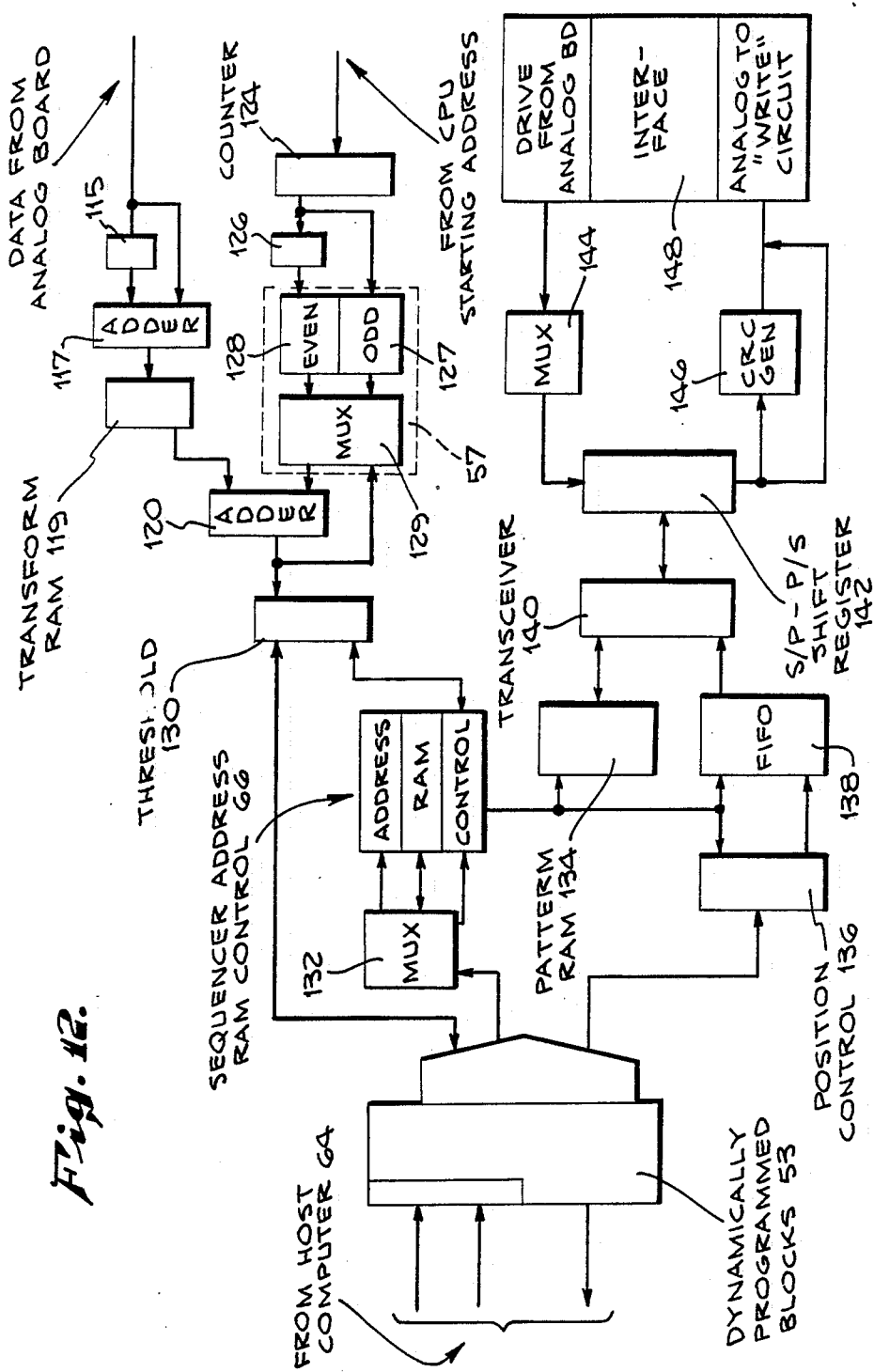

In order to maximize the warm air flow around the disk drive component 18, a disk drive sleeve 22 (also in FIG. 4) forms the disk drive compartment 16 (FIG. 1) which houses each disk drive 18 during testing within the test chamber 14. Connector cables 19 are inserted through connector plug 44 (see FIGS. 4 and 10) into which the disk drive 18 makes electrical connection with a ribbon cable leading to the disk drive test units 36. As the drive 18 is inserted into the sleeve 22, the drive passes over a disk drive alignment guide 46 and pushes pivotal door 25 upward, whereby the disk drive 18 is keyed into the sleeve 22 so that it is properly aligned for connection with the plug 44 and secure fitting within the sleeve 22. When tests have been completed and the disk drive 18 is to be removed from the test chamber 14 and sleeve 22, a disk drive release pawl 20 is provided for leverage to allow release of the disk drive 18 out from the sleeve 22 along the alignment guide 46. The pawl 20 is pivotally connected at pivot point 21 and is formed in a solid L shaped configuration. As the pawl 20 is lifted upward at the forward outside edge of the sleeve 22, the pawl 20 rotates about the pivot 21 whereby pawl leg 23 (integral with the pawl 20) releases the disk drive unit 18 from the sleeve 22. The pawl 20 functions to prevent unnecessary twisting and distortion of either the plugs 44 or the connector pins (not shown) of the disk drive 18 so that guided alignment of the pins may be maintained. Each empty compartment (defined by the sleeve 22) has a hanging pivotal door 25 to maintain the uniform elevated temperature of the disk drive chamber Turning now to FIG. 11, a detailed physical construction of the test units 36 (FIG. 3) is shown. The test unit 36 is plugged into a test unit receiving slot 38 and through the sealant strips 23 (FIG. 7) at the forward end of the bus interface board 102 (FIG. 11). Seated below the bus interface board 102 are the test unit power regulator board 105 and the power regulator 104 of the drive board. A heat sink 108 protects the overall test unit 36 from excessive heat. The digital board 106 is seated directly above the bus interface board 102 and has cable connecting means for connecting the digital board 106 with the interface board 102 and other boards of the test unit 36. (The detailed connection of ribbon cables between the boards is not shown for ease of viewing test unit 36.) The analog board 110 is positioned above the digital board 106 and has an independent heat sink 109. A host computer board 112 is provided above the digital board 106 and positioned adjacent the analog board 110. A latch 113 is provided for securing the test unit 36 in position within the test unit chamber 42 (FIG. 7).

Figure 13:
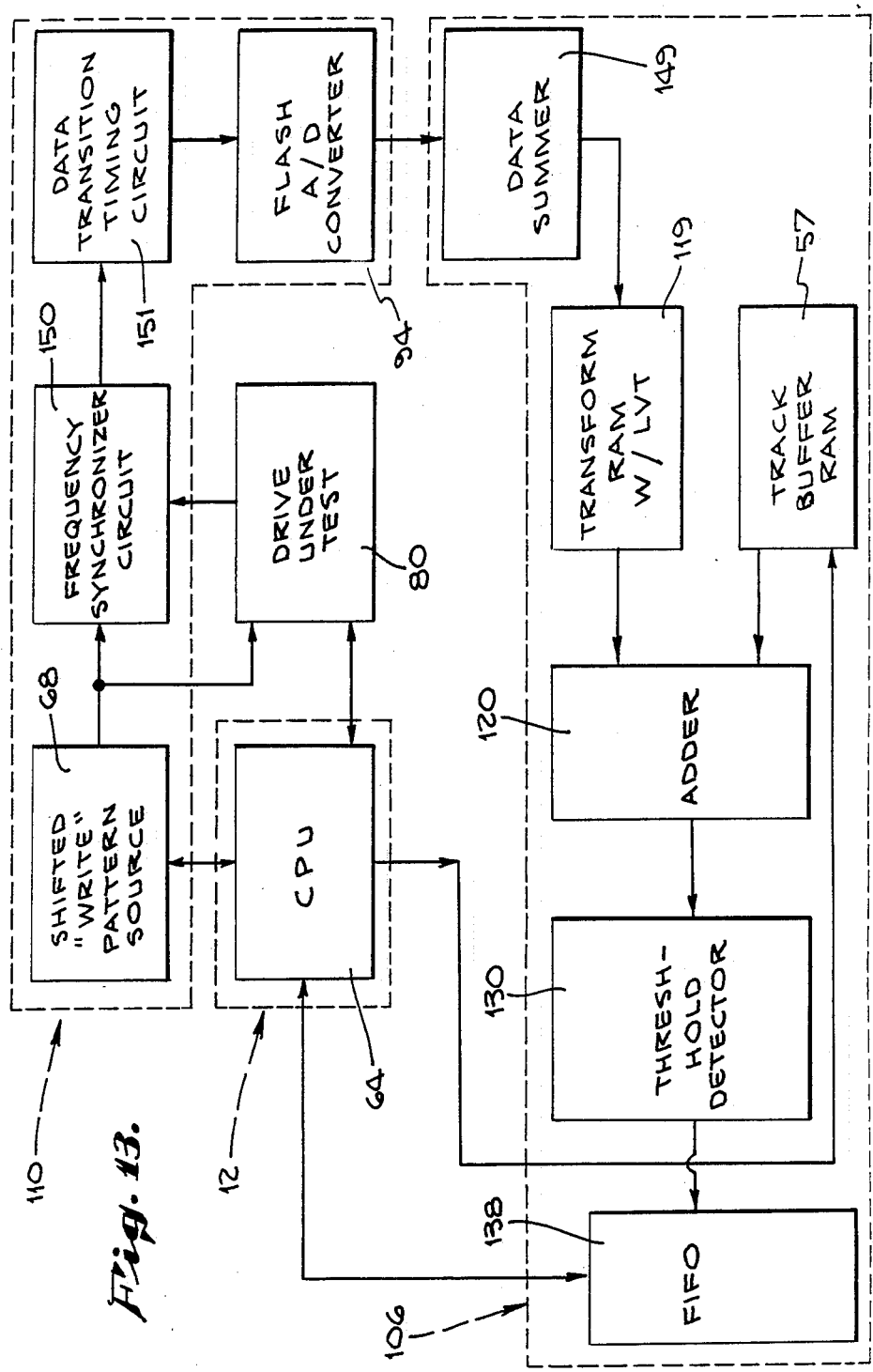
FIG. 13 shows a schematic block diagram of the operation of the overall testing system showing how a drive unit under test is operatively associated with the various components of the testing units and the host computer.

A generalized block diagram showing the functions of various components of a test unit 36 interacting with a drive under test 80 is shown in FIG. 13. A central processing unit (CPU) 64, of the host computer board 112 (schematically shown in dotted lines), bi-directionally interacts with respect to the drive 80, the analog board 110 and the digital board 106. In this manner, the CPU 64 can access directly the Winchester disk drive-undertest 80, by-passing the internal controller of the drive 80. The analog board (symbolically shown within the dotted lines 110) has a preprogrammed or programmable (by the CPU 64) shifted "write" pattern source 68 which feeds data to the drive-under-test 80, at a rate monitored by the frequency synchronizer circuit 150. The frequency synchronizer circuit 150 (the phase locked loop 90 and phase detector 88 of FIG. 14) synchronizes the data rate of the drive unit under test 80 with the rate that the shifted write pattern source 68 provides written data to the drive-under-test 80. Data is read from the drive-under-test 80 through the frequency synchronizer circuit 150. The data transmission timing circuit 151 provides an analog signal to the A/D converter 94 of the analog board 110 which is proportional to the amount of time from the end of the previous data window to the time within the new data window that the drive 80 indicates a read of a flux transition. The data recorded in the data window may or may not be written into the window by pattern source 68.

In this manner the analog board 110 can provide a number to the digital board 106 which is representative of an absolute value of the time measured within each data cell of the drive 80 from the center of the cell. Signals written by shifted right pattern source 68 are written within each data cell at pre programmed shifted locations of the drive 80. In the preferred embodiment, the number assigned by the A/D converter 94 to this timing record of data transition is a number from zero to 256. The data transition timing circuit 151 is triggered to measure the time it takes within each data cell of the drive-under-test 80 to transition a flux on the recording medium indicating the presence of recorded data previously written on the disk drive of the drive-under-test 80. The circuit 151 is calibrated according to an algorithm to establish the limits of each data window according to the equation: $D.L. = (MN-N.D.R.)^2/Sf$
where:

D.L. (Data Location) is a number between 0–256 locating the flux transition with the cell;

the mean (M) is a cumulated average of the window center location of prior "Reads";

"N.D.R." is the "Read" of the newest data bit; and,

Sf (scaling factor) is a statistically derived slope plotted from a plurality of earlier reads of the data cell according to the least square, best-fit law.

The digitised output of the flash A/D converter 94 is presented to a data summer 149 of the digital board 106. The data summer 149 cummulates bit positioning information gathered from each data cell of the drive under-test 80 and sums this information for presentation to a transfer RAM 119. The transfer RAM 119 of the digital board 106 has a look up table which defines the input data received according to predetermined definitions related to tolerable limits within which the data recorded within each data cell may operate. In most cases, for example, the output of the transform RAM 119 will be "zero"; this is an indication that the cumulative data provided by the data summer 149 to the transfer RAM 119 was not sufficiently off center to cause concern for the presence of media defects. Only a limited number of values from the data summer 149 will trigger a relatively higher output from the transform RAM 119.

The Transform Ram Table below exemplifies typical contents of the Transform Ram 119 contents for all 512 addresses within the Ram.

TRANSFER RAM TABLE

| I Addresses | II Output Value | I Addresses | II Output Value |
|---|---|---|---|
| 000–001 | 43 | 244–329 | 0 |
| 002–003 | 42 | 330–347 | 1 |
| 004–007 | 41 | 348–361 | 2 |
| 008–011 | 40 | 362–373 | 3 |
| 012–013 | 39 | 374–383 | 4 |
| 014–017 | 38 | 384–393 | 5 |
| 018–021 | 37 | 394–401 | 6 |
| 022–025 | 36 | 402–409 | 7 |
| 026–029 | 35 | 410–417 | 8 |
| 030–031 | 34 | 418–423 | 9 |
| 032–035 | 33 | 424–431 | 10 |
| 036–039 | 32 | 432–437 | 11 |
| 040–043 | 31 | 438–443 | 12 |
| 044–047 | 30 | 444–449 | 13 |
| 048–051 | 29 | 450–455 | 14 |
| 052–055 | 28 | 456–461 | 15 |
| 056–059 | 27 | 462–465 | 16 |
| 060–063 | 26 | 466–471 | 17 |
| 064–069 | 25 | 472–475 | 18 |
| 070–073 | 24 | 476–481 | 19 |
| 074–077 | 23 | 482–485 | 20 |
| 078–081 | 22 | 486–491 | 21 |
| 082–087 | 21 | 492–495 | 22 |
| 088–091 | 20 | 496–499 | 23 |
| 092–097 | 19 | 500–503 | 24 |
| 098–101 | 18 | 504–509 | 25 |
| 102–107 | 17 | 510–511 | 26 |
| 108–111 | 16 | | |
| 112–117 | 15 | | |
| 118–123 | 14 | | |
| 124–129 | 13 | | |
| 130–135 | 12 | | |
| 136–141 | 11 | | |
| 142–149 | 10 | | |
| 150–155 | 9 | | |
| 156–163 | 8 | | |
| 164–171 | 7 | | |
| 172–179 | 6 | | |
| 180–189 | 5 | | |
| 190–199 | 4 | | |
| 200–211 | 3 | | |
| 212–225 | 2 | | |
| 226–243 | 1 | | |

This output from the transfer RAM 119 is added to information from a track buffer RAM 57 and forwarded to an adder 120 for a final determination by a digital threshold detector 130. The locations of the abnormal values presented to the digital threshold detector 130 which exceed preprogrammed limitations are sent to the FIFO register 138 for storage in future access by the central processing unit 64 of the host computer 112. The central processing unit 64 also loads the track buffer RAM 57 in order to vary the tests performed on the digitized data received from the analog board 110.

In this manner, the test system for each pair of disk drives and test units completes a test of a single test unit by first calibrating drive under test 80 and synchronizing that information with shifted "write" patterns written a predetermined "distance" off the center of each data cell in the drive under test 80. After the shifted write pattern source 68 writes onto a complete track of the drive under test 80, that track is read. The output data from the track is provided to the data transition timing circuit 151 where it is converted into a digitized number for enhanced processing within the digital board 106. The absolute number which is provided by the flash A/D converter 94 of the analog board 110 to the data summer 149 of the digital board 106 is an absolute representation of where the drive 80 reads the data transition within each data cell. The efficiency of how well the drive 80 repeats the data already written by the shifted "write" pattern 68 provides further measurement of media and location of media defects in the disk drive. A quick and efficient location of the position of media defects in the drive 80 may thus be obtained.

Figure 14:
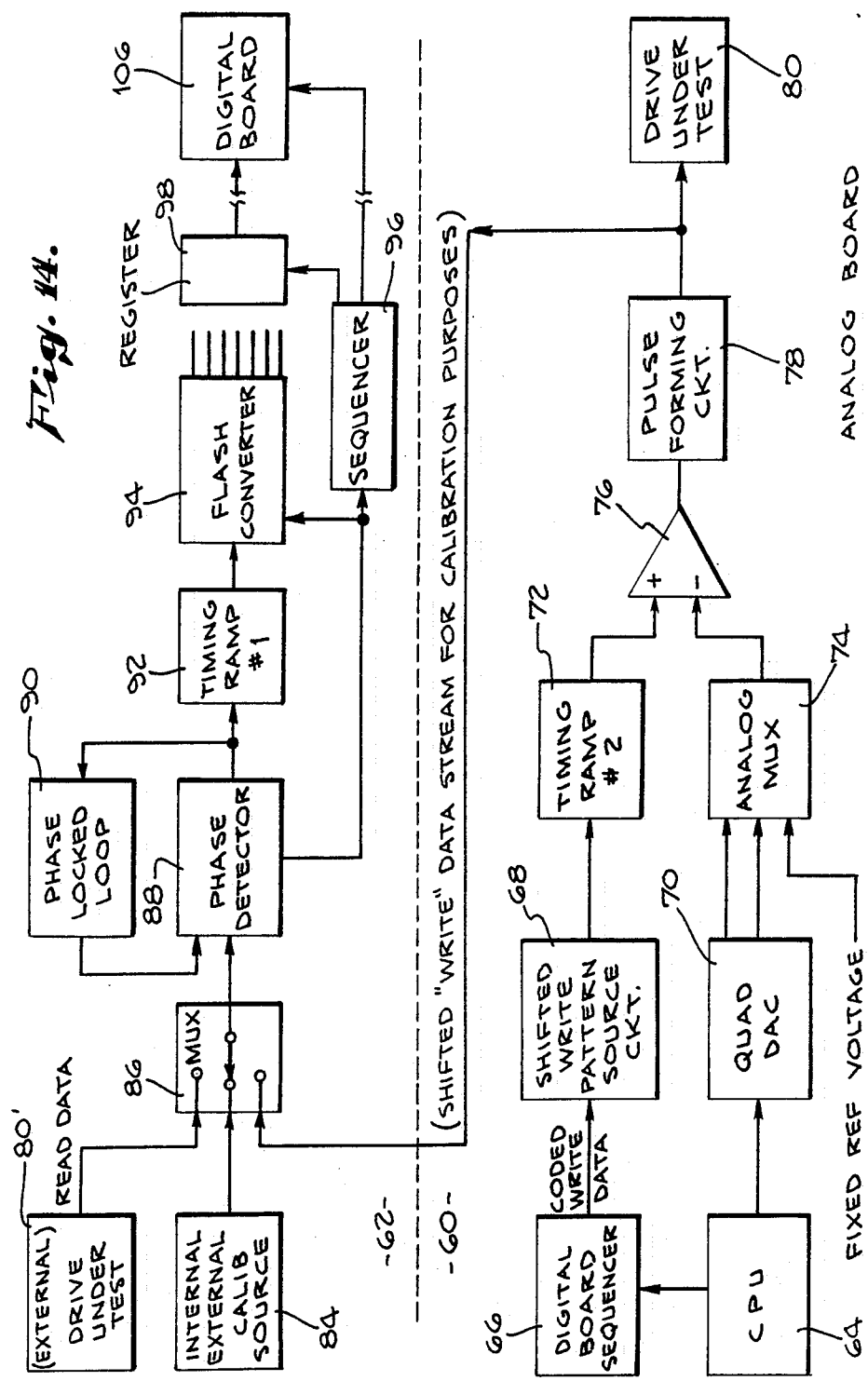
FIG. 14 is a schematic block diagram of the analog board configuration of the test unit.

A more detailed view of the electronic system for testing Winchester disk drives for the presence for media defects on their respective disks is shown in FIGS. 12, 14, and 15.

With reference to FIG. 14, before testing of an external drive under test (80') is conducted, a timing ramp 92 is calibrated with the use of an internal/external calibration source 84 such as a crystal controlled oscillator. The multiplexer 86 allows connection of the calibration source 84 through the phase detector 88 and phase locked-loop 90 for use by the timing ramp 92. The timing ramp 92 is then calibrated to uniformly count equally spaced time intervals set by the calibration source 84.

For example, the timing ramp 92 may effectively divide each data cell of the drive 80' (the same drive as drive-under-test 80) into 256 time intervals for the purpose of providing data on the location of flux transitions within the data cell of the drive-under-test 80. After the calibration source 84 is used to calibrate the timing ramp 92, a drive 80, which has data written into each of the data cells for a given track, is then run through the multiplexer 86 for monitoring by the phase detector 88 and phase locked-loop 90 of the analog board of the test unit 36. The timing ramp 92 is initially turned "on" by a signal from the drive-undertest 80,, indicating the end of a previous data window. From that endpoint of a previous data window, the timing ramp 92 is initiated in its upward climb over a period of time no greater than the width of a data cell (50 nanoseconds) of the drive 80'. (Each count is about 250 pico seconds or $250 \times 10^{-12}$ seconds.) As soon as a flux transition is detected within the new data cell, the magnitude of the timing ramp 92 is sampled. This sampled voltage level is provided to an A/D converter 94, which then converts the analog voltage signal into a number ranging (in the preferred embodiment,) from zero to 255 (a 256 number count). Signals from the phase detector indicate to the flash converter 94 when it should stop counting thereby assigning a number to the voltage level output of the timing ramp 92. A sequencer 96 is also triggered which shifts data from a register 98 in a pipeline manner to the digital board 106. The register 98 is then made available for the next number from the A/D converter 94. In practice, the sampling may also be accomplished from the flux transition to the end of the window or data cell.

In addition to the hereinbefore described measuring circuit 62 of analog board (FIG. 14), a shifted write pattern source circuit 68 (FIG. 14) may provide prepositioned data to the drive 80 which is then read through to the flash converter 94 in order to determine how accurately the drive 80' is responding to data write inputs. While the ability of the drive 80' to read data is judged by the measuring circuit 62 of FIG. 10, circuit 60 may be used to calibrate and "write" data onto a disk drive to be tested to determine how faithfully the drive 80 reproduces data that has just been written on the track to be tested. The central processing unit 64 provides command signals to a digital board sequencer 66 which instructs the pattern source circuit 68 to write data at a certain point in time along a time continuum measured by timing ramp 72.

The timing ramp 72 is calibrated in much the same manner as timing ramp 92. The calibration source 84 is used by the timing ramp 72 so that the timing ramp 72 may be synchronized with the timing ramp 92. The data is then written onto the drive under test 80 at the same rate that it will be read out drive 80'. A quad digital-to-analog (D/A) converter 70 may be used to provide a reference signal to a voltage comparator 76. Alternatively, a fixed voltage reference may be provided to an analog multiplexer 74 which is used as a voltage reference for comparator 76. Since the timing ramp 72 is identical to timing ramp 92, it is effectively providing an analog output representative of a point in time within each data cell of the drive 80. In other words, since the flash converter 94 converts voltage output of the timing ramp 92 into a number from zero to 55, and the timing ramp 72 is effectively counting time as the timing ramp 92 (according to the same scale as timing ramp 92), since timing ramp 72 and timing ramp 92 are calibrated by the same calibration source 84. Thus, as the output of the timing ramp 72 crosses the reference voltage set by the analog multiplexer 74, the output of the comparator 76 triggers the pulse forming circuit 78.

The pulse forming circuit 78 provides a flux transition to the magnetic media of the track of the disk drive 80 so that data is effectively written at a predetermined location within a given data cell. All of this is preprogrammed by the central processing unit 64.

A more detailed version of the manner in which a shifted write pattern is provided by circuit 60 to the drive 80 is shown in FIG. 15. Programmable patterns of data are stored in programmable permanent PROMS 158 and 160, and programmable logic device (PLD), 162. Bus lines connect these PROMS to the remainder of the circuitry and allow access by the central processing unit 64 of FIG. 14. The central processing unit 64 may store a number in buffer 152 which is converted by the digital to analog (D/A) converter 154 into a voltage level C or D, both of which are provided through the voltage multiplexer 156.

Alternatively, a fixed D/C level of voltage may also be provided to the multiplexer. Programming from the shifted pattern write source 68 determines which of the voltage levels will be selected. Circuit 68 also provides (through NOR gate 164) a trigger to flip-flop 166 to enable a ramp (by means of ramp enable circuit 168). The comparator 170 compares a preset threshold voltage level from one of these outputs of voltage multiplexer 156 when triggered by the RAM enable circuit 168.

The output of this comparator is then presented to the pulse stretcher circuit 172 which is provided to a single input of the AND gate 174. Signals from the bus line of the PROMS 162, 158, and 160 (which PROMs comprise the shifted pattern write source 68) provide input by way of an inverter, to a second AND gate 178. The outputs of AND gates 174 and 178 are then provided to the NOR gate 176 for output through the inverter 180 directly to the drive 80 (FIG. 14); alternatively the output is latched to the remaining portion of the analog board circuitry. In this manner, circuit 68 is able to shift the positioning of data about the center of each data cell of a track of the drive-under-test 80, so the data is deliberately written a known distance from the center of each selected cell to test the ability of that cell to respond to data positioned at various locations within each data cell.

This enhanced and fine tune positioning of data within the data cells allows one to find defects within a track which would not otherwise be detected but for the ability to write data according to a preprogrammed positioning on the data track. In other words, FIG. 15 shows in detail the ability of circuit 68 of FIG. 14 to write data along all the data cells of a given data track (of a disk under test 80 in a disk drive 18) at particular locations within each data cell of that track, so that the ability of the track to reproduce the data originally written into it may be tested for flaws within the disk media.

At each phase of testing, approximately 111,000 data cells per track are tested at each pass by the testing system as described in FIGS. 13, 14 and 15. If a preprogrammed message is written into a track of the drive 80, then that same message should be read back when measuring circuit 62 of FIG. 14 is operated, to read the data previously recorded on the track. If the message output of measuring circuit 62 differs from the message written by circuit 60 onto the drive-under-test 80, then the presence and location of a media defect on drive 80, may be found and analyzed in detail.

FIG. 12 shows a block diagram of the digital components contained in the digital board 106 of FIG. 11. The host computer 64 bi-directionally communicates with dynamically programmed blocks 53. These blocks 53 interact with the multiplexer 132, the position counter 136, and nearly all the remaining component blocks of FIG. 12 as shown. Data is received from the analog board by adder 117. That data is added to data previously presented to the data latch 150. The output of the adder 117 is provided to the transform RAM 119, where it is combined in a second adder 120, together with the output of a track buffer RAM 57. The track buffer RAM 57 is comprised of even address banks 128 and odd address banks 127, and has a multiplexer 129 associated with the address banks 127 and 128. The track buffer RAM 57 is loaded by the CPU through address counter 124 and latch 126. The adder 120 continues to loop back to the multiplexer 129 of the track buffer RAM 157 until a number of repetitive additions of data at the second adder 120 is obtained. For example, data may be written eight times onto the same track and sequentially read, then written, so as to build up or enhance the amount of data present in the track buffer RAM 57 and the transform RAM 119. After a predetermined number of "reads" of data from the same track, that result is presented to the threshold detector 130. After eight separate runs of data through the same track, by the time that data reaches that threshold detector 130), any random errors uniquely present in the track but not as a result of media, defects will be flagged and eliminated from any further consideration.

The threshold information is provided to the dynamically programmed blocks 53 for access by the host computer 64 as well as to the control of the sequencer control 66. The sequencer control 66 has an address counter and internal RAM as well as an internal control. The sequencer control 66 provides data to the FIFO register 138 for storage of the address of those locations which have unusual and skewed data, representative of a media defect.

Access to the FIFO is controlled by the position counter 136, which is operated by the dynamically programmed blocks 53. Alternatively, the sequencer control 66 may be used to operate the pattern RAM 164 which is connected through the transceiver 140 for direct communication to the analog board and drive-under-test 80 (FIG. 13). Both the FIFO 138 and the pattern RAM 134 are connected, via the transceiver 140, with the series-to-parallel and parallel-to-series shift register 142 for communication directly to the analog board and "write" circuit of the analog board 110. Data may be directly accessed from the drive (through the analog board) through the multiplexer 144 and to the shift register 142. A cyclic redundancy check (CRC) may be undertaken, to test the accuracy of data written on the drive according to industry standards. Alternatively the CRC generator 146 may be bypassed and data from the pattern RAM 134 be written directly on the drive 80 (FIG. 13) for subsequent reading to determine the accuracy of the drive function. In this manner, data received from the analog board 110 (FIG. 13) is provided to the digital board 106 for cumulative and enhanced processing so that defects may be analyzed and detected in greater detail than is heretofore been achieved.

With reference to FIG. 16, there is shown a graphic representation of a data cell 200 within a track of a disk drive 80 (FIG. 13). The center line 202 of the data cell is indicated, and is statistically derived to account for random drift or errors of a non-media derived nature.

The data cell 200 is shown to be 50 nano seconds wide. The shifted "write" pattern souce 68 (FIG. 13) is preprogrammed to write an "early" (206) or late signal (208), as well as a normal signal (204). If into a string of data cells like 200 is written a series of patterns such as:

Early, late, normal, early;

then, the ability of the "read" circuitry 62 (FIG. 14) to reproduce this pattern will be a further indication of the presence or absence of media flaws or defects.

If an extra pulse is read, or the order of pulses as written is not properly reproduced, this result might indicate the presence of a disk media flaws or defects.

While the preferred embodiment of an environmentally controlled media defect detection system for Winchester disk drives has been disclosed herein, alternative equivalent embodiments may also be envisioned which do not depart significantly from the spirit of the invention disclosed herein. For example, a single disk drive may be tested by a test unit and be removable from the testing cabinet 10 of FIG. 1, due to the modular nature of the test drive units 36 (FIG. 3), each unit 36 being associated with a single disk drive 18, surrounded in the testing cabinet 10 by the test sleeve 22. Therefore, the appended claims are intended to cover the invention disclosed herein as well as equivalent means for carrying out the invention as taught in the preferred embodiment.

What is claimed is:

1. A system for testing Winchester disk drives comprising:
   a testing cabinet including first and second sections;
   said first section including means for environmentally controlling the temperature therein at an elevated temperature,
   said second section being thermally insulated from said first section;
   said first section including a plurality of racks for receiving Winchester drives to be tested;
   said second section including a plurality of individual test units each coupled via separate coupling means to a corresponding one of said Winchester drives;
   said test units each including means for applying digital memory medium test signals to said drives, for reading said signals from said drives, and for determining malfunctions in each of said drives.

2. The system for testing Winchester disk drives of claim 1, wherein:
said means for applying digital signals to said drives, includes a shifted "write" pattern source circuit;
said means for reading said signals from said drive includes:
a frequency synchronizer circuit, operatively associated with,
a data transition timing circuit; and,
a flash A/D converter which converts an analog output signal from said data transition timing circuit to a digitized signal for further processing by a digital system; and,
said means for determining malfunctions in each of said drives includes:
said digital board including:
data summer means;
a transformer RAM with a look-up Table (LUT); said transformer RAM providing an input signal to an adder;
said adder operatively associated with a track buffer which provides a second input signal to said adder;
the output signal from said adder provided to a threshold detector means;
the threshold detector means processing said adder output signal and providing data to a FIFO register means where said adder output signal exceeds a pre-set limit.

3. A system for testing the accuracy and precision of a disk drive for a Winchester hard disk system, comprising:
an environmentally controlled testing cabinet, having a plurality of disk drive compartments for housing a Winchester disk drive;
for each disk drive compartment, a corresponding test board compartment for housing a disk drive test board, each test board applying digital memory medium test signals to its corresponding disk drive and reading said signals from the disk drive to determine a malfunction therein;
means for coupling each disk drive test board with its corresponding disk drive;
an air flow means including a thermostatically controlled means for maintaining a predetermined selected temperature in said disk drive compartment;
means for environmentally and thermally isolating the disk drive compartments from said test board compartments;
so, that independent environmental control of the disk driven compartment can be separately maintained.

4. The system for testing the accuracy and precision of a disk drive for a Winchester hard disk system of claim 3, wherein:
said means for environmentally isolating the disk drive compartments from said test board compartments includes:
a double-walled partition;
a first wall of said partition providing a connector means for said disk drive;
said first wall supporting said at least one disk drive compartment;
a second partition wall defining a plurality of slots for receiving said disk drive test board and supporting at least one of said test board compartment;
sealing means for air-tight sealing said slots of said second partition wall;
whereby said disk drive compartments are environmentally isolated from said test board compartments, even though disk drives are electrically connected to said test boards.

5. The system for testing the accuracy and precision of a disk drive for a Winchester hard disk system of claim 3,
wherein said disk drive compartment for housing said Winchester disk drive comprises:
a disk drive sleeve, said sleeve configured to surround said disk drive on four sides;
said disk drive telescoped within said sleeve during testing;
said sleeve including a pivotally hinged drive receiving door, which door hangs vertically downward to close off said drive compartment when said compartment is empty;
said sleeve having guide means to align said drive into said sleeve; and,
said sleeve including a pivotally mounted arm and pawl for easily ejecting said drive from said sleeve.

6. A system for testing Winchester disk drives comprising:
a testing cabinet including first and second sections;
said first section including a plurality of racks for receiving Winchester drives to be tested;
said second section including a plurality of test units each coupled via coupling means to a corresponding one of said Winchester drives;
said test units including means for applying digital memory medium test signals to said drives, for reading said signals from said drives, and for determining malfunctions in each of said drives;
said first section including means for environmentally controlling the temperature therein at an elevated temperature, including:
a plurality of ventilation fans for intake of ambient air and for circulation of said intake ambient air through a plurality of ducts and over each of said Winchester drives in said first section;
heating means for heating said intake air as it circulates through said ducts; and,
said heating means controlled by a thermostatic controller means;
said second section being thermally insulated from said first section.

7. The system for testing Winchester disk drives of claim 6, wherein said heating means are heating coils.

8. A system for testing the accuracy and precision of a disk drive for a Winchester hard disk system, comprising:
an environmentally controlled testing cabinet, having at least one disk drive compartment for housing a Winchester disk drive;
for each disk drive compartment, a corresponding test board compartment for housing a disk drive test board;
means for coupling each disk drive test board with its corresponding disk drive;
an air flow means including:
a separate air circulation means comprising a plurality of air circulating fans for intake of ambient air and directing said ambient air into a plurality of air ducts;
said air ducts directing said intake air uniformly to said disk drive compartment;
thermostatically controlled heater means for heating said intake air in said air ducts to a pre-set temperature for maintaining said disk drive compartment at a uniform temperature;

means for environmentally isolating the disk drive compartments from said test board compartments;

whereby independent environmental control of the disk driven compartment can be separately maintained.

9. The system for testing the accuracy and precision of a disk drive for a Winchester hard disk system of claim 8, wherein said heater mans includes heating coils, said heating coils operatively associated with a thermostatic controller and a temperature sensor probe positioned within said disk-drive compartment.

* * * * *